(12) United States Patent
Greer

(10) Patent No.: US 6,545,569 B1
(45) Date of Patent: Apr. 8, 2003

(54) FILTERING DEVICE AND METHOD OF ELIMINATING A DC COMPONENT BY SHIFTING THE TRANSFER FUNCTION

(75) Inventor: Nigel Greer, Hottot les Bagues (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/454,346

(22) Filed: Dec. 3, 1999

(30) Foreign Application Priority Data

Dec. 8, 1998 (FR) .............................. 98 15484

(51) Int. Cl.[7] .............................................. H03H 11/08
(52) U.S. Cl. ........................ 333/215; 333/174; 327/559
(58) Field of Search ................................ 333/215, 174; 327/555, 559

(56) References Cited

U.S. PATENT DOCUMENTS

| | | | |
|---|---|---|---|
| 3,618,133 A | * 11/1971 | Gingell | .................... 333/215 X |
| 5,548,244 A | 8/1996 | Clewer | ........................ 329/318 |
| 5,955,985 A | * 9/1999 | Kemkemian et al. | ....... 342/109 |

OTHER PUBLICATIONS

By Gwilym Luff: "A Single–Chip VHF and UHF Receiver for Radio Paging" IEEE International Solid State Circuits Conference vol. 34, Feb. 1, 1991 pp. 120–121.

By Michiel Steyaert "RF IC Design for Wireless Communications Systems" Lausanne, Switzerland, Jun. 23–27, 1997.

\* cited by examiner

*Primary Examiner*—Justin P. Bettendorf
(74) *Attorney, Agent, or Firm*—Michael Schmitt

(57) ABSTRACT

Filters and methods for eliminating a DC component from an electronic signal provide for circuitry having a zero corresponding to a cut-off frequency, and circuitry for shifting the zero by an amount corresponding to the absolute value of that cut-off frequency. The filters and methods, which include integration and operation of gyrators, are particularly well-suited for incorporation in integrated circuits by virtue of reducing the physical size of the required capacitors. A further advantage is the reduction of time-dependent inertia. Applications of the filters and methods include, but are not limited to, radiotelephony.

9 Claims, 4 Drawing Sheets

Figure 1:
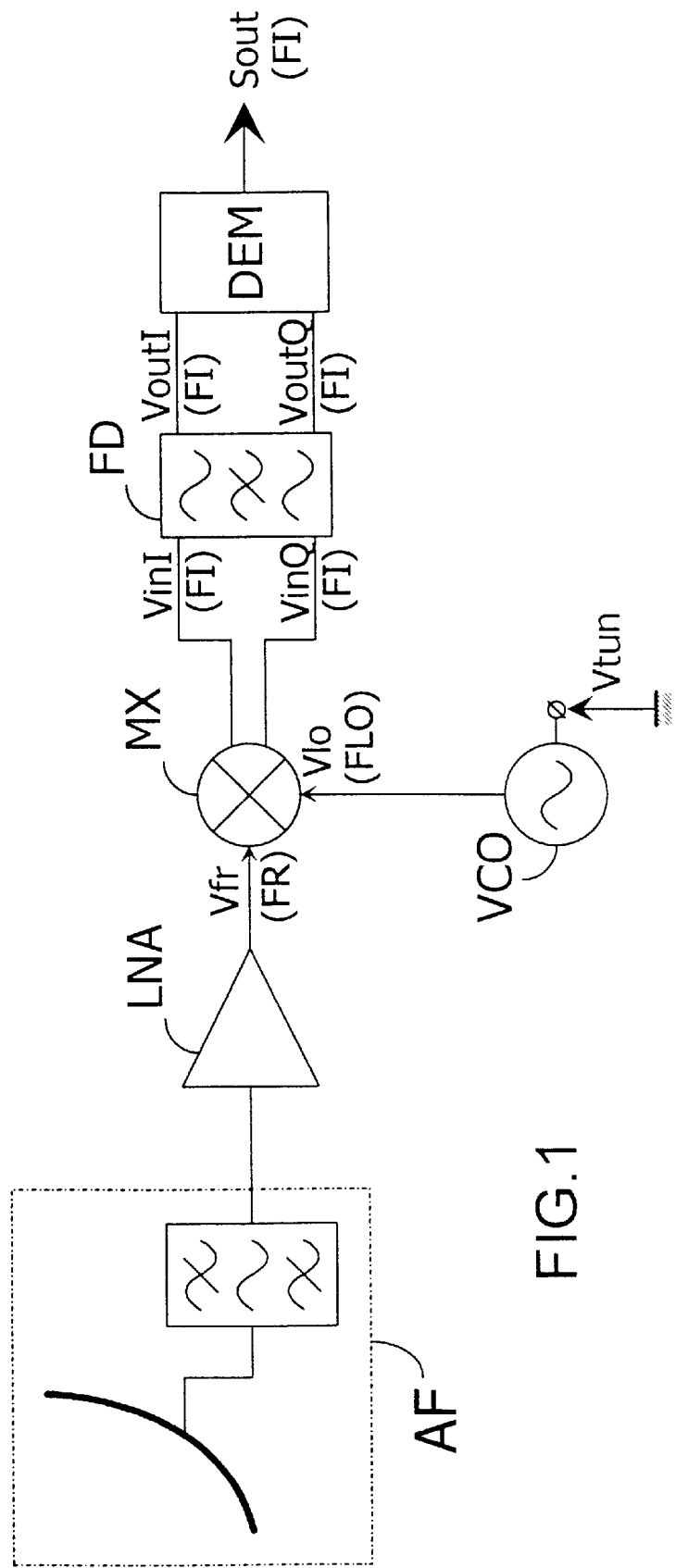

FILTERING DEVICE AND METHOD OF ELIMINATING A DC COMPONENT BY SHIFTING THE TRANSFER FUNCTION

The present invention relates to a filtering device intended to eliminate a DC component from an electronic signal.

Such filtering devices are currently used in apparatus used for the reception of radio signals, such as television sets or radiotelephones. These apparatus conventionally comprise a receiving circuit, arranged at the end of an antenna and filter system intended to ensure the reception of a radio signal and to deliver, on an output, an electronic signal that represents said signal, which receiving circuit comprises an amplifier connected to the output of the antenna and filter system and intended to deliver an amplified electronic signal, a mixer having a first input connected to the output of the amplifier, a second input intended to receive a signal coming from a local oscillator, and an output, and a demodulator having an input connected to the output of the mixer and an output intended to deliver a frequency-demodulated audio signal.

The output of the mixer and the input of the demodulator are often twinned, intended to deliver and receive respectively pairs of signals having the same shape in phase quadrature. The elements included in the receiving circuit described above generally considerably amplify the signals they process, because of the low initial amplitude of the radio signal. If the signal processed by one of the elements mentioned above possesses a DC component, this component will also be amplified, thus causing a considerable shift of the AC component of the processed signal, which AC component contains the useful information transported by the signal. Such a shift may cause a saturation of output stages intended for the amplification of the processed signal, or also input stages of elements intended to receive the amplified signal and thus cause a peak limiting of said signal, leading to an alteration of the information it represents, which is unacceptable.

Accordingly, in the apparatus intended for the reception of radio signals described above, a filtering device is often inserted between the mixer and the demodulator with the aim of eliminating the DC component from the output signal of the mixer. The filtering devices used for this purpose are often high-pass filters formed by a resistor and a capacitor, which filters have a threshold frequency beyond which they pass signals, which frequency is chosen to be lower than the frequency of the AC component of the mixer output signal which is fixed and called intermediate frequency.

The use of such a high-pass filter raises considerable drawbacks. The value of the intermediate frequency being of the order of ten or one hundred kHz, for the threshold frequency one conventionally chooses a value of the order of one kHz for the cut-off frequency. As this value is relatively low, the realization of the high-pass filter requires a capacitor having a relatively high value, of the order of one NanoFarad. In the current state of integrated circuit technology, such a capacitor can only be realized in a discrete form, which implies that the use of a high-pass filter described above is an obstacle to the complete integration of the receiving circuit, which is, however, desirable in view of the reduction of the bulkiness and the consumption of said circuit. Besides, a high-pass filter including a high-value capacitor has a long time constant and thus introduces inside the receiving circuit considerable time-dependent inertia. In radiotelephones in accordance with the GSM or TDMA standards, the receiving circuit is only active during brief periods in which said circuit is to ensure the reception of a data packet, after which it is again deactivated. Each activation of the receiving circuit is followed by an initialization phase, after which the reception is possible. The time-dependent inertia caused by the high-value capacitor included in the high-pass filter may increase the duration of the initialization phase at the expense of the time interval allocated to the circuit for receiving the data packet, which may be harmful to the proper operation of the receiving circuit. Finally, the frequency demodulation of the output signal of the mixer must not be disturbed by a dissymmetry of the signal with regard to the intermediate frequency. Consequently, the receiving circuit is to provide an as much as possible symmetrical transfer characteristic around the intermediate frequency. The transfer characteristic of a high-pass filter is symmetrical around the zero frequency and thus causes a considerable dissymmetry of the transfer characteristic of the receiving circuit with regard to the intermediate frequency, which may also be undesirable for the proper operation of said circuit.

It is an object of the present invention to largely remedy these drawbacks by proposing an integrable filtering device which has a time-dependent inertia that is smaller than that of known filtering devices and preserves the symmetry of the transfer characteristic of the receiving circuit with regard to the intermediate frequency.

Indeed, a filtering device according to the invention, having a first and a second input to receive a first and a second input signal respectively, the second input signal being identical to the first but in phase quadrature to the first, and a first and a second output intended to deliver a first and a second output signal respectively, the second output signal being identical to the first but in phase quadrature to the first, comprises: a first elliptical filter including N capacitive elements Ci (for i=1 to N), arranged between the first input and the first output, the filter having a transfer characteristic that offers at least a zero at a predetermined frequency called the cut-off frequency, a second elliptical filter, identical to the first elliptical filter, arranged between the second input and the second output, and N gyrators Gi (for i=1 to N), each connected in parallel between two corresponding capacitive elements Ci (for i=1 to N), of the first and second elliptical filters, the gyrators being designed so that the filtering device has a similar transfer characteristic to that of the first and second elliptical filters while featuring a shift whose extent is equal to the absolute value of the cut-off frequency.

In such a filtering device, one may use easily integrable low-value capacitors by choosing a relatively high value for the cut-off frequency. The gyrators then provide the shift of the transfer characteristic of the filtering device. Besides, as will be seen hereinafter, this transfer characteristic regains a shape corresponding to a bandpass filter beyond the disturbance caused by the zero of the filter. The symmetry of the transfer characteristic of the filtering device according to the invention is thus largely preserved.

In a particular embodiment of the invention, a filtering device as described above is characterized in that, while each gyrator Gi (for i=1 to N) has a transconductance gi and has a first and a second input intended to receive a first and a second current $I1i$ and $I2i$ respectively, and a first and a second output intended to deliver the first and second current $I1i$ and $I2i$ respectively, and said gyrator is intended to develop a first voltage $V1i$ between its first input and output, and a second voltage $V2i$ between its second input and output, the behavior of each gyrator is defined by the relationships $I1i=(gi)(V2i)$ and $I2i=(-gi)(V1i)$, and $gi=(2T\pi)(Fc)(Ci)$, where Fc is the absolute value of the cut-off frequency.

Such a configuration of the gyrators enables to easily obtain the shift of the zero of the transfer characteristic of the filtering device, so that this zero corresponds to the zero frequency.

In a preferred embodiment of the invention, all the capacitive elements $C_i$ (for i=1 to N) included in the first and second elliptical filters have an identical nominal value, and all the gyrators $G_i$ (for i=1 to N) are mutually identical.

The fact that the nominal values of the capacitors are the same and the fact that the gyrators are identical enables to reduce the influence of the imperfections due to the manufacturing process of the filtering device, said imperfections thus having the same effect on all the gyrators and all the capacitors in theory. The choice to have the same nominal values of the capacitive elements $C_i$ thus enables to obtain a homogeneity of the dynamic of the signal flowing through the filtering device. Finally, such a choice enables to simplify and optimize the design and the floorplan of the integrated circuit including the filtering device, and thus to reduce its size and cost.

As explained above, the use of a filtering device in accordance with the invention is particularly advantageous inside a radio signal receiving circuit. Hence the invention also relates to a radiotelephony device, comprising an antenna and filter system intended to ensure the reception of a radio signal and to deliver on an output an electronic signal representing said signal, an amplifier connected to the output of the antenna and filter system and intended to deliver an amplified electronic signal, a mixer having a first input connected to the output of the amplifier, a second input intended to receive a signal that comes from a local oscillator, and an output intended to deliver a signal that has a fixed frequency called intermediate frequency, and, a demodulator having an input connected to the output of the mixer and an output intended to deliver a frequency-demodulated audio signal, which device is characterized in that it further includes a filtering device as described above, inserted between the mixer and the demodulator, while the elliptical filters included in said filtering device have the intermediate frequency for their cut-off frequency.

Finally, in the most general form, the invention relates to a method of eliminating a DC component from an electronic signal, comprising making a configuration of a filter so that it has a transfer characteristic that offers at least a zero at a predetermined frequency, called the cut-off frequency, providing a shift of said transfer characteristic, the extent of which shift is equal to the absolute value of the cut-off frequency, and causing said electronic signal to flow through said filter thus obtained.

These and other aspects of the invention are apparent from and will be elucidated, by way of non-limitative example, with reference to the embodiment(s) described hereinafter.

Figure 2:
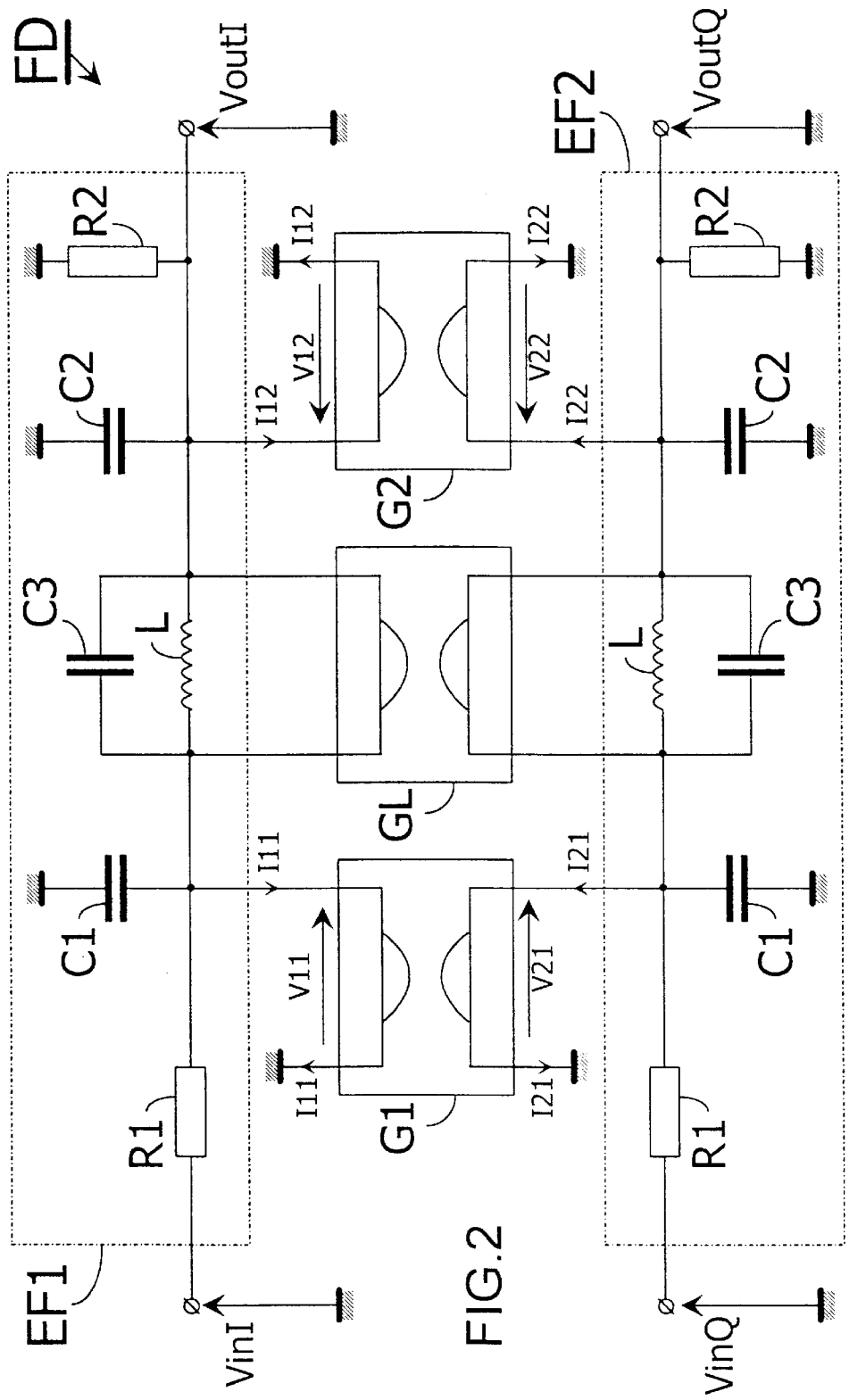
Figure 3:
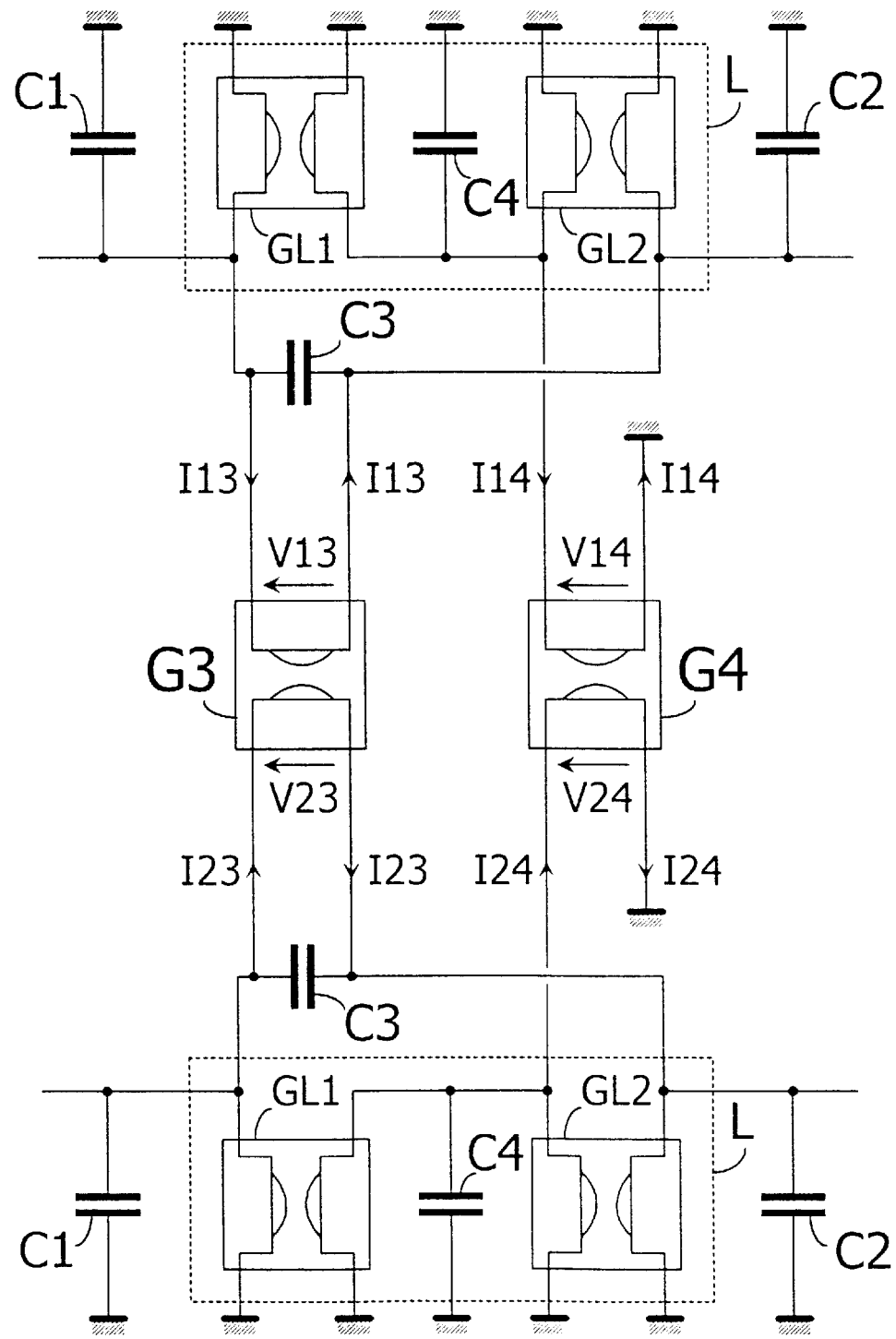
Figure 4:
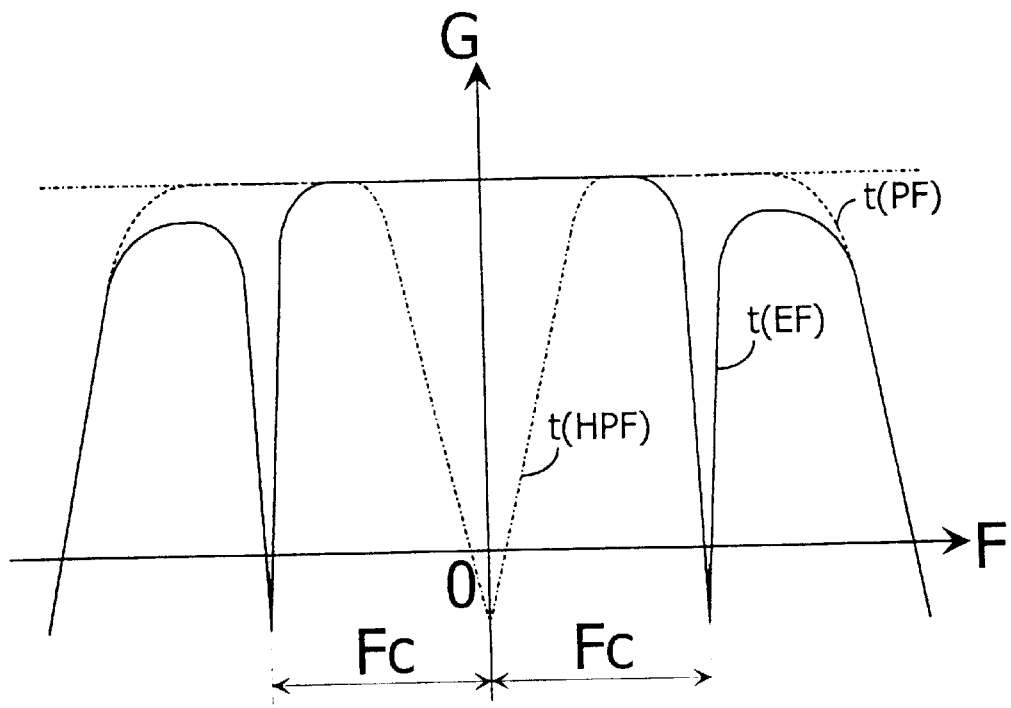
Figure 5:
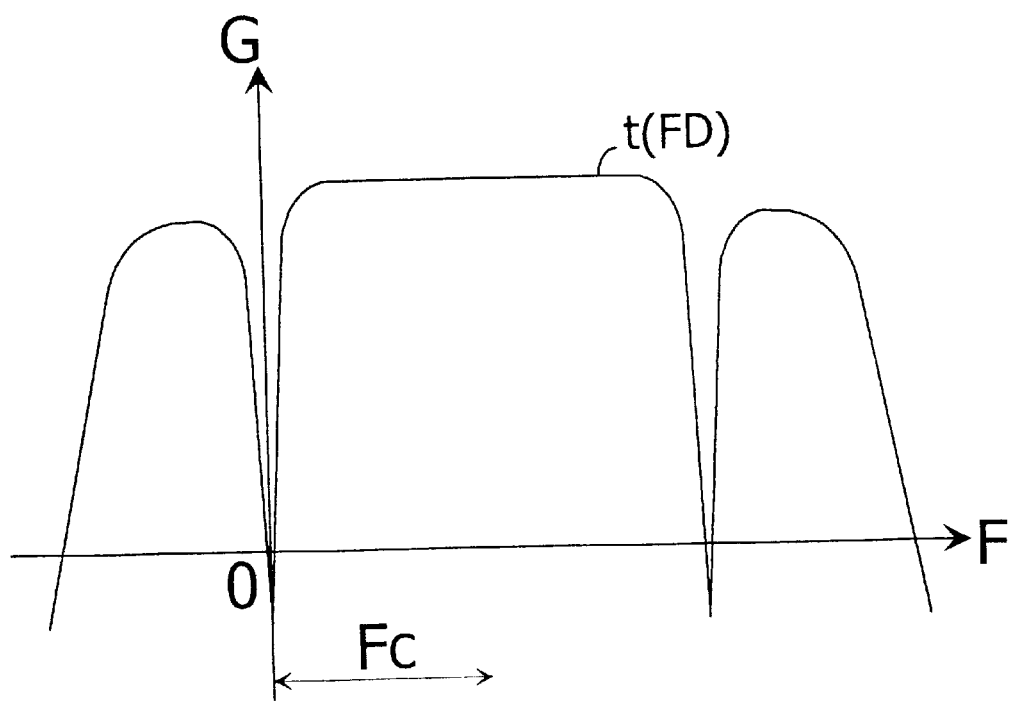

In the drawings:

FIG. 1 is a functional diagram partly describing a radiotelephony device which includes a filtering device according to the invention, FIG. 2 is an electrical diagram describing a filtering device in accordance with the invention, FIG. 3 is an electrical diagram describing a part of a filtering device in accordance with a particular embodiment of the invention, FIG. 4 is a curve representing the transfer characteristic of an elliptical filter included in a filtering device in accordance with the invention, and FIG. 5 is a curve representing the transfer characteristic of a filtering device in accordance with the invention.

FIG. 1 diagrammatically represents a radiotelephone. This device comprises a receiving circuit arranged at the end of an antenna and filter system AF intended to ensure the reception of a radio signal and the delivery on an output of an electronic signal that represents said signal. The receiving circuit comprises an amplifier LNA connected to the output of the antenna and filter system AF and intended to deliver on an output an amplified electronic signal Vfr, a mixer MX having a first input connected to the output of the amplifier LNA, a second input intended to receive a signal Vlo coming from a local oscillator VCO, and an output, and a demodulator DEM having an input connected to the output of the mixer MX and an output intended to deliver a demodulated audio signal Sout.

The output of the mixer MX and the input of the demodulator DEM are double, intended to deliver and receive respectively pairs of signals having the same shape in phase quadrature (VinI, VinQ) and (VoutI, VoutQ) and a frequency FI usually called intermediate frequency. The elements included in the receiving circuit described above considerably amplify the signals they process, because of the low initial amplitude of the radio signal. In order to reduce the risks of saturation or peak limiting of the signal flowing through the receiving circuit, which would alter the information transported by said signal, a filtering device FD is inserted between the mixer MX and the demodulator DEM to eliminate the DC component from the output signal (VinI, VinQ) of the mixer MX.

FIG. 2 is an electrical diagram and represents an easily integrable filtering device FD, whose time-dependent inertia is smaller than that of the known filtering devices, and whose influence on the symmetry of the transfer characteristic of the receiving circuit is reduced. This filtering device FD has a first and a second input, intended to receive a first and a second input signal VinI and VinQ respectively, the second input signal VinQ being identical to the first but in phase quadrature to the first, and a first and a second output intended to deliver a first and a second output signal VoutI and VoutQ respectively, the second output signal VoutQ being identical to the first but in phase quadrature to the first. This filtering device FD comprises a first elliptical filter EF1 which includes a third-order passive filter arranged between the first input and the first output. This passive filter is formed by a first and a second resistor R1 and R2, a first and a second capacitor C1 and C2 and an inductor L arranged between the first and second capacitors C1 and C2. In this example of embodiment, the filter EF1 is rendered elliptical by a third capacitor C3 connected in parallel to the inductor L, thus creating a parallel L-C circuit connected in series to the path of the signal flowing through the filter EF1. In another embodiment one will be able to choose to connect a series L-C circuit in parallel with the path of the signal flowing through the filter EF1. The elliptical filter EF1 represented here has a transfer characteristic that shows at least a zero at a predetermined frequency called cut-off frequency. The filtering device FD comprises a second elliptical filter EF2, identical to the first elliptical filter EF1, arranged between the second input and the second output, and two gyrators G1 and G2 each being connected in parallel between two corresponding capacitive elements C1 and C2 of the first and second elliptical filter EF1 and EF2. The gyrators have such a configuration that the filtering device FD has a transfer characteristic that is similar to that of the first and second elliptical filter while featuring a shift whose extent is equal to the absolute value Fc of the cut-off frequency. The gyrators are elements that are well known to a person of ordinary skill in the art and their possible embodiments are manifold. Each gyrator Gi (for i=1 or 2) has a transconductance gi and has a first and a second input intended to receive a first and a second current I1$i$ and I2$i$ respectively, and a first and second output intended to deliver the first and the second current I1$i$ and I2$i$ respectively. The gyrator Gi is intended to develop a first voltage V1$i$ between its first input and output, and a second voltage V2$i$ between its second input and output, while the behavior of each gyrator Gi may be defined by the relationships I1$i$=gi.V2$i$ and I2$i$=−gi.V1$i$. An embodiment of such a gyrator particularly advantageous in that it can be integrated in the form of an assembly of active elements, is described in a publication by L'Ecole Polytechnique de Lausanne entitled <<RF IC Design for Wireless Communication Systems>>. According to the FIG. 2, the filtering device FD comprises another gyrator G1 connected in parallel to the third capacitor C3 of the first and second elliptical filters EF1 and EF2. This gyrator is complex and differs from the first and second gyrators G1 and G2 and forms the object of a separate description.

FIG. 3 describes an embodiment of the inductor L and a complex gyrator GL. This separate presentation has for its object to reduce the density of the Figures so as to facilitate the comprehension of the various parts that form the filtering device FD. For the sake of clarity, the first and second resistors R1 and R2 and the first and second gyrators G1 and G2 are not shown in this Figure. In the embodiment described here, each inductor L is realized in the form of two gyrators GL1 and GL2 both connected in parallel to a fourth capacitor C4. Such an embodiment is known to a person of ordinary skill in the art and has for its object to facilitate the realization in integrated form of the inductors L of the first and second elliptical filters EF1 and EF2. A third gyrator G3 is connected in parallel between the third capacitors C3 of the first and second elliptical filters EF1 and EF2, and a fourth gyrator G4 is connected in parallel between the fourth capacitors C4 of the first and second elliptical filters EF1 and EF2. There is thus a gyrator connected in parallel between each pair of corresponding capacitive elements of the first and second elliptical filters EF1 and EF2.

The first, second, third and fourth gyrators Gi (for i=1 to 4) have such a configuration that the filtering device FD has a similar transfer characteristic to that of the first and second elliptical filters EF1 and EF2, while showing a shift whose extent is equal to the absolute value Fc of the cut-off frequency. A particular embodiment of the invention, in which is chosen gi=2.Π.Fc.Ci (for i=1 to 4), enables to easily obtain such a shift. In a preferred embodiment of the invention, all the capacitive elements Ci (for i=1 to 4) included in the first and second elliptical filters EF1 and EF2 will have an identical nominal value and all the gyrators Gi (for i=1 to 4) realizing the frequency shift will be identical to each other.

By way of example, if one chooses for the cut-off frequency Fc a value equal to that of the intermediate frequency, of the order of one hundred kHz, the capacitors Ci will have nominal values of the order of one PicoFarad in the embodiment described with reference to FIGS. 1 and 2, and the transconductance gi will be of the order of one Microsiemens. Such capacitors are easily integrable and do not cause a large time-dependent inertia for the filtering device whose time constant will be of the order of one microsecond if the resistors it includes are of the order of one hundred kilohms.

FIG. 4 represents a transfer characteristic t(EF) describing the evolution of the gain as a function of the frequency of either elliptical filter described above. This Figure further describes in a dotted line the shape the transfer characteristic t(PF) of a third-order filter would have. The Figure further describes in a dash-and-dot line the shape the transfer characteristic t(HPF) of a high-pass filter intended for the elimination of a DC component would have. At a frequency Fc, the transfer characteristic t(EF) shows a zero created by the presence of a parallel L-C circuit in series with the path of the signal flowing through the elliptical filter. This zero is found back by symmetry in the domain of the negative frequencies at the frequency −Fc. Beyond this zero, the transfer characteristic t(EF) rejoins the transfer characteristic t(PF) which has the symmetrical shape of a bandpass filter.

FIG. 5 represents a transfer characteristic t(FD) describing the evolution of the gain as a function of frequency in the filtering device according to the invention. This characteristic t(FD) has a similar shape to that of the elliptical filter described earlier, but has undergone a frequency shift of +Fc because of the gyrators and accordingly presents a zero at the zero frequency. This ensures the elimination by the filtering device according to the invention of the DC component from the signal that passes through the filtering device. If in this example a choice has been made to make a shift in the direction of the rising frequencies, a shift in the opposite direction may also be easily realized and will also ensure the filtering of said DC component. The symmetry of the transfer characteristic t(FD) with regard to the cut-off frequency Fc, which will advantageously be chosen at the intermediate frequency, is thus largely safeguarded, which is not the case for the high-pass filter whose transfer characteristic t(HPF) is symmetrical around the zero frequency.

What is claimed is:

1. A method of eliminating a DC component from an electronic signal output from a mixer, comprising:

making a configuration of a filter so that it has a transfer characteristic that offers at least a zero at a predetermined frequency, called the cut-off frequency;

providing a shift of said transfer characteristic, the extent of which shift is equal to the absolute value of the cut-off frequency; and causing said electronic signal to flow through said filter thus obtained;

wherein the shifted transfer characteristic is symmetric with respect to the electronic signal output from the mixer.

2. A filtering device having a first and a second input intended to receive a first and a second input signal respectively, the second input signal being identical to the first but in phase quadrature to the first, and a first and a second output intended to deliver a first and a second output signal respectively, the second output signal being identical to the first but in phase quadrature to the first, comprising:

a first elliptical filter including N capacitive elements Ci (for i=1 to N), arranged between the first input and the first output, the filter having a transfer characteristic that offers at least a zero at a predetermined frequency called the cut-off frequency, a second elliptical filter, identical to the first elliptical filter, arranged between the second input and the second output, and N gyrators Gi (for i=1 to N), each connected in parallel between two corresponding capacitive elements Ci (for i=1 to N), of the first and second elliptical filters, the gyrators being designed so that the filtering device has a similar transfer characteristic to that of the first and second elliptical filters while featuring a shift whose extent is equal to the absolute value of the cut-off frequency;

wherein the first and second elliptical filters, together with the N gyrators provide a transfer characteristic that is symmetrical with respect to the frequency of the first and second input signals.

3. A filtering device as claimed in claim 2, characterized in that, while each gyrator Gi (for i=1 to N) has a transconductance gi and has a first and a second input intended to receive a first and a second current I1$i$ and I2$i$ respectively, and a first and a second output intended to deliver the first and second current I1$i$ and I2$i$ respectively, and said gyrator is intended to develop a first voltage V1$i$ between its first input and output, and a second voltage V2$i$ between its second input and output, the behavior of each gyrator is defined by the relationships: I1$i$=(gi)(V2$i$) and I2$i$=(−gi)(V1$i$), and gi=(2Π)(Fc)(Ci), where Fc is the absolute value of the cut-off frequency.

4. A filtering device as claimed in claim 3, characterized in that while all the capacitive elements Ci (for i=1 to N) included in the first and second elliptical filters have an identical nominal value, all the gyrators Gi (for i=1 to N) are mutually identical.

5. A filter device, comprising:
  a first filter, including N capacitive elements C1$i$ (i=1 to N) arranged between a first input terminal adapted to receive a first signal from a mixer, the first filter having a transfer characteristic including a zero at a predetermined cut-off frequency;
  a second filter, including N capacitive elements C2$i$ (i=1 to N), arranged between a second input terminal adapted to receive a signal that is phase shifted from the first signal, the second filter having a transfer characteristic including a zero at the predetermined cut-off frequency; and
  at least N gyrators Gi (i=1 to N), each connected in parallel between two corresponding capacitive elements C1$i$ and C2$i$ (i=1 to N), of the first and second filters, the gyrators configured such that the filter device has a transfer characteristic similar to that of the first and second filters but shifted by an amount equal to the absolute value of the cut-off frequency;
    wherein the first and second filters, together with the N gyrators provide a transfer characteristic that is symmetrical with respect to the frequency of the first and second input signals.

6. The filter device of claim 5, wherein the first and second filters are elliptical filters.

7. The filter device of claim 5, wherein capacitors C1$i$ and C2$i$ (i=1 to N) are disposed on an integrated circuit.

8. The filter device of claim 7, wherein the cut-off frequency is equal to the frequency of the first and second input signals.

9. The filter device of claim 8, wherein the cut-off frequency is approximately 100 kHz and the capacitors Ci (i=1 to N) each have a nominal value of one picofarad.

* * * * *